United States Patent
Lovitt

(10) Patent No.: US 9,350,335 B1
(45) Date of Patent: May 24, 2016

(54) SINGLE STAGE LATENCY COMBINED MULTIPLEXER AND LATCH CIRCUIT

(71) Applicant: Travis William Lovitt, Ottawa (CA)

(72) Inventor: Travis William Lovitt, Ottawa (CA)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/863,880

(22) Filed: Sep. 24, 2015

(51) Int. Cl.
*H03M 9/00* (2006.01)
*H03K 3/356* (2006.01)

(52) U.S. Cl.
CPC ........... *H03K 3/356113* (2013.01); *H03M 9/00* (2013.01)

(58) Field of Classification Search
CPC .......................... H03M 9/00; H03K 3/356113
USPC ................................................. 341/100–101
See application file for complete search history.

(56) References Cited

U.S. PATENT DOCUMENTS

| | | | | |
|---|---|---|---|---|
| 6,188,339 B1* | 2/2001 | Hasegawa | ............... | H03K 5/151 326/115 |
| 7,154,918 B2* | 12/2006 | Takauchi | ................ | H03M 9/00 327/407 |
| 7,460,039 B2* | 12/2008 | Jeon | ........................ | H03M 9/00 341/100 |
| 8,094,047 B2* | 1/2012 | King | ....................... | H03M 9/00 327/408 |
| 8,493,248 B2* | 7/2013 | Fan | ......................... | H03M 9/00 341/101 |

* cited by examiner

*Primary Examiner* — Khai M Nguyen

(57) ABSTRACT

A combined multiplexer and latch circuit is provided that has only a single gate delay between the input of the overall circuit and the output of the circuit. Two complementary input signal stages each receive a complementary input signal and a multiplexer input. A clocked preset circuit presets a signal at the output of the combined multiplexer and latch circuit with timing based on a first phase of an input clock. A storage circuit stores a value based on the output of the combined multiplexer and latch circuit with timing based on a second phase of the input clock. The circuit has a preset mode during which the output of the combined multiplexer and latch circuit is preset, and has a latch mode during which a value output by the selected complementary signal input stage is output by the circuit and also stored in the storage circuit.

20 Claims, 6 Drawing Sheets

SINGLE STAGE LATENCY COMBINED MULTIPLEXER AND LATCH CIRCUIT

FIELD

The application relates to multiplexers and latches.

BACKGROUND

In electronics, a multiplexer (or mux) is a device that selects one of several analog or digital input signals and forwards the selected input into a single line.

In electronics, a flip-flop or latch is a circuit that has two stable states and can be used to store state information. The circuit can be made to change state by signals applied to one or more control inputs and will have one or two outputs. It is the basic storage element in sequential logic. Multiplexers and latches are fundamental building blocks of digital electronics systems used in computers, communications, and many other types of systems.

BRIEF DESCRIPTION OF THE DRAWINGS

Embodiments of the disclosure will now be described with reference to the attached drawings in which.

DETAILED DESCRIPTION

Figure 1:
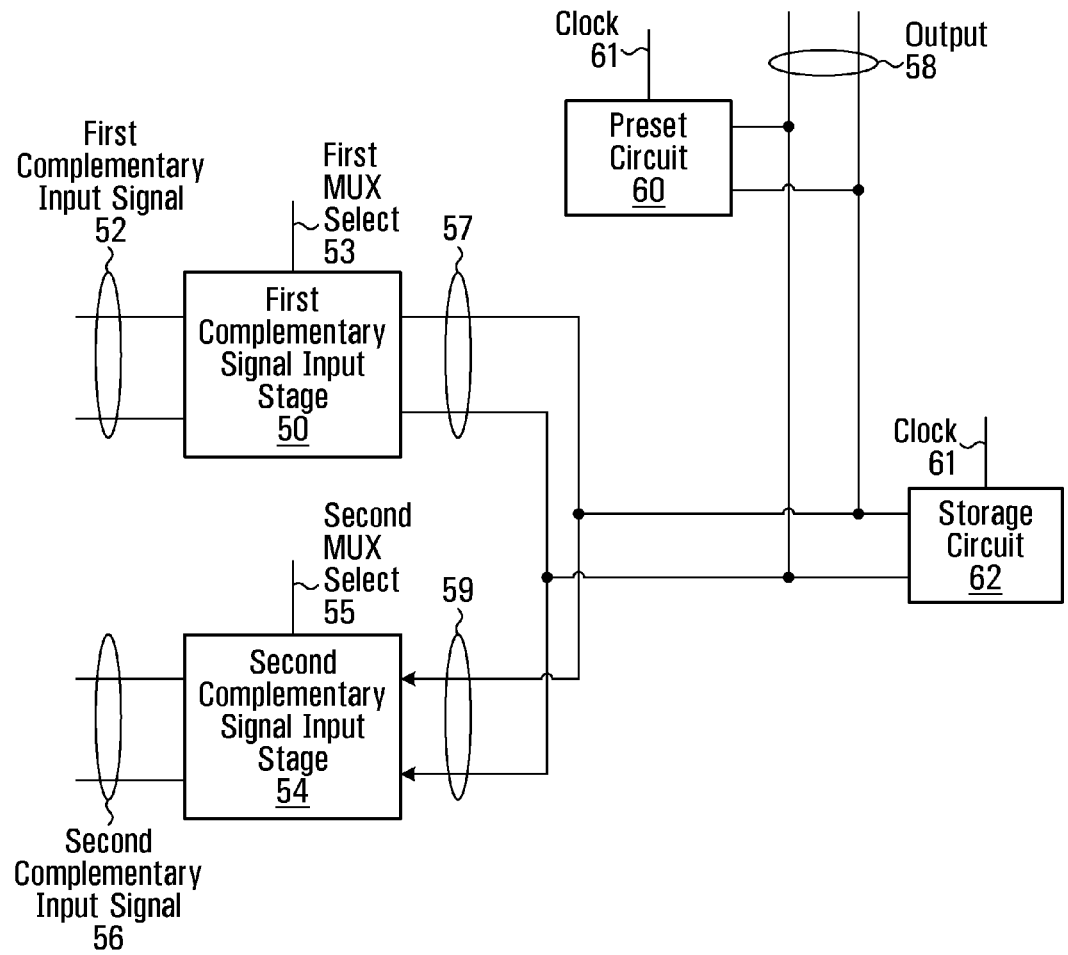
FIG. 1 is a simplified block diagram of a combined multiplexer and latch circuit provided by an embodiment of the invention.

Typically, when a circuit requires a multiplexer (mux) followed by a latch, there is at least a two gate delay between the input and the output. This will include at least one gate delay in the mux, and another gate delay at the latch. This can be problematic for use in circuits requiring high speed, for example in a decision feedback equalizer used in high speed applications.

In accordance with an aspect of the invention, a combined multiplexer and latch circuit is provided that has a gate delay between an input to the circuit and the output of the circuit. In an example, the gate delay is only a single gate delay. The circuit has a first complementary signal input stage comprising a first input circuit and a second input circuit for receiving respective components of a first complementary input signal. The first complementary signal input stage is also for receiving a first multiplexer select input signal that enables the first complementary signal input stage. The first complementary signal input stage has an output connected to an output of the combined multiplexer and latch circuit. The first complementary signal input stage has a single gate delay between an input of the first complementary signal input stage and the output of the combined multiplexer and latch circuit. There is a second complementary signal input stage comprising a first input circuit and a second input circuit for receiving respective components of a second complementary input signal. The second complementary signal input stage is also for receiving a second multiplexer select input signal that enables the second complementary signal input stage. The second complementary signal input stage has an output connected to the output of the combined multiplexer and latch circuit. The second complementary input signal has a single gate delay between an input of the second complementary signal input stage and the output of the combined multiplexer and latch circuit. A clocked preset circuit presets a signal at the output of the combined multiplexer and latch circuit with timing based on a first phase of an input clock. A storage circuit for storing a value based on the output of the combined multiplexer and latch circuit with timing based on a second phase of the input clock. The circuit has a preset mode during which the output of the combined multiplexer and latch circuit is preset, and has a latch mode during which a value output by the selected complementary signal input stage is output by the circuit and also stored in the storage circuit.

Another aspect of the invention comprises a method that begins with receiving a first complementary input signal and a first multiplexer select signal with a first complementary signal input stage comprising a first input circuit and a second input circuit for receiving respective components of the first complementary input signal. While selected by the first multiplexer select signal, the first complementary signal input stage produces an overall output based on the first complementary input signal with a single gate delay between receipt of the first complementary input signal and the overall output. A second complementary input signal and a second multiplexer select signal are received with a second complementary signal input stage comprising a first input circuit and a second input circuit for receiving respective components of the second complementary input signal. While selected by the second multiplexer select signal, the second complementary signal input stage produces the overall output based on the second complementary input signal with a single gate delay between receipt of second complementary signal input stage and the overall output. In a preset mode, a signal at the overall output is preset with timing based on a first phase of an input clock. In a latch mode, a value is stored based on the overall output with timing based on a second phase of the input clock.

Referring now to FIG. 1, shown is a combined multiplexer and latch circuit provided by an embodiment of the invention. The circuit has a first complementary signal input stage 50 for receiving a first complementary input signal 52, and for receiving a first multiplexer select input 53 that enables the first complementary signal input stage. The first complementary signal input stage 50 has an output 57 connected directly (more generally, so as not to introduce substantial delay) to an output 58 of the combined multiplexer and latch circuit. In an example, there is a single gate delay between the input 52 and the output 58.

The circuit has a second complementary signal input stage 54 for receiving a second complementary input signal 56, and for receiving a second multiplexer select input 55 that enables the second complementary signal input stage. The second complementary signal input stage 54 has an output 59 connected directly (more generally, so as not to introduce substantial delay) to the output 58 of the combined multiplexer and latch circuit. Note there is a single gate delay between the input 56 and the output 58.

There is a clocked preset circuit 60 that presets a signal at the output 58 of the combined multiplexer and latch circuit with timing based on a first phase of an input clock 61. In addition, there is a storage circuit 62 for storing a value based on the output 58 of the combined multiplexer and latch circuit with timing based on a second phase of the input clock 61.

The circuit has a preset mode during which the output 58 of the combined multiplexer and latch circuit is preset by the preset circuit 60, and has a latch mode during which a value output by the selected complementary signal input stage is output by the circuit and also stored in the storage circuit 62. In some embodiments, the preset mode is based on a first phase of the clock cycle and the latch mode is based on a second phase of the clock cycle. In some embodiments, preset mode is based on clock high, and latch mode is based on clock low, and in other embodiments, preset is based on clock low, and latch mode is based on clock high.

The description above refers to single gate delay. Conventionally, single gate delay is defined to exist when the longest path from input data to output data is the delay time of a single transistor gate turning on. However, note that the delay of a single gate can vary. In general the larger the device the lower the delay, but the higher the power. However, there is a lower limit to the delay regardless of size that has to do with the time for a transistor channel to turn on.

Figure 2:
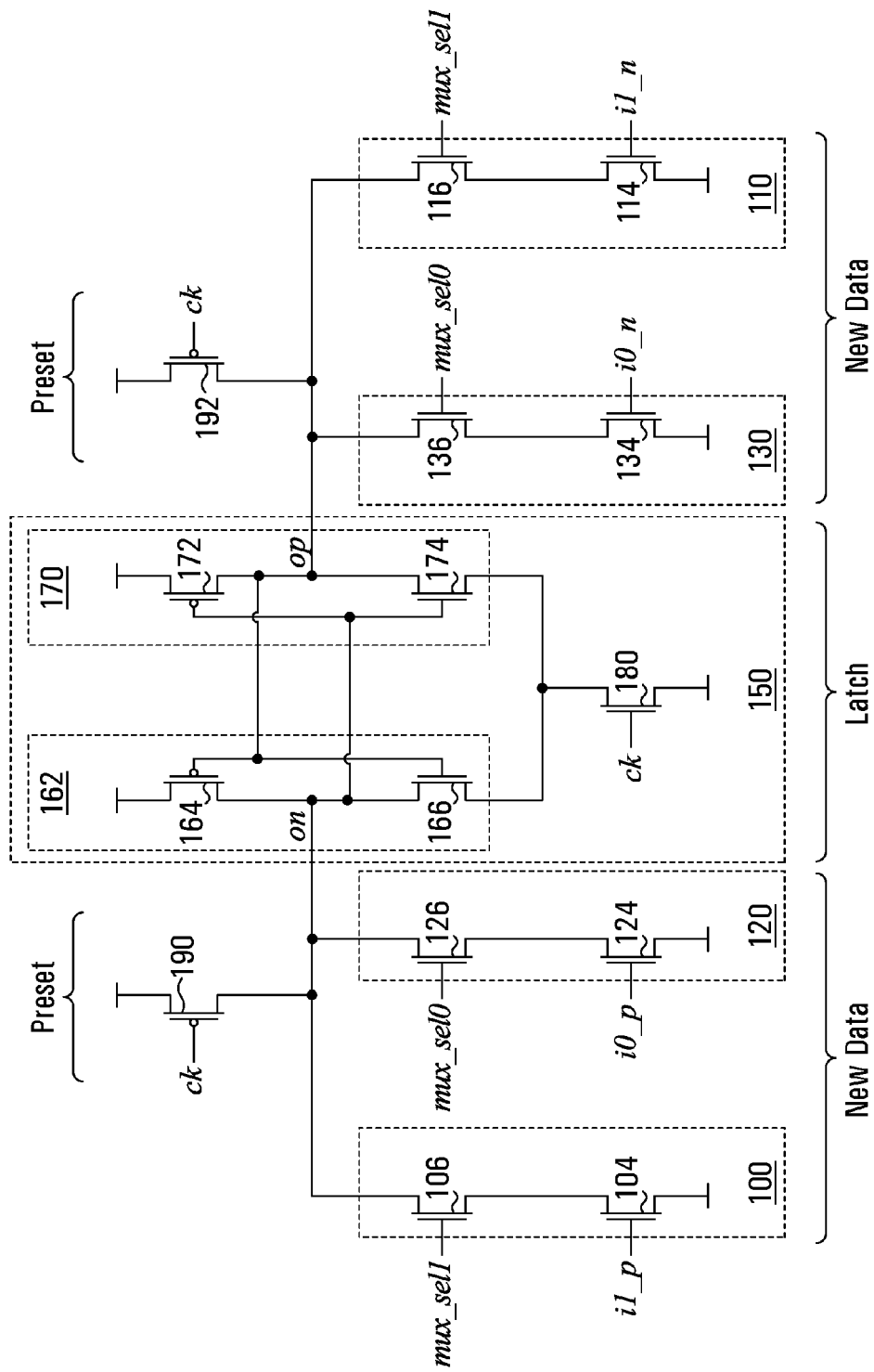
FIG. 2 is a simplified circuit diagrams of a combined multiplexer and latch circuit provided by an embodiment of the invention.

Referring now to FIG. 2, shown is a circuit diagram of a combined multiplexer and latch circuit provided by an embodiment of the invention. This is a specific example of the combined multiplexer and latch circuit of FIG. 1. For brevity, the same name will be used for nodes, and for the signals that would exist at the nodes during operation. For example, the output nodes op,on will also be said to carry output signals op,on.

The circuit has a first complementary signal input stage that includes circuits 100 and 110. Circuit 100 includes transistors 104,106 connected together in sequence between node on and ground. The input of transistor 104 is connected to node i1_p and the input of transistor 106 is connected to node mux_sel1. It is noted that for input stage 100, and other input stages described herein, the order of connections can be reversed. That is, the multiplexer select input mux_sel1 could instead be connected to transistor 104, and the data input i1_p could instead be connected to transistor 106. Similarly, circuit 110 includes transistors 114,116 connected together in sequence between node op and ground. The input of transistor 114 is connected to node i1_n and the input of transistor 116 is connected to node mux_sel1.

The circuit has a second complementary signal input stage that includes circuits 120 and 130. Circuit 120 includes transistors 124,126 connected together in sequence between node on and ground. The input of transistor 124 is connected to node i0_p and the input of transistor 106 is connected to node mux_sel0. Similarly, circuit 130 includes transistors 134,136 connected together in sequence between node op and ground. The input of transistor 134 is connected to node i0_n and the input of transistor 136 is connected to node mux_sel0.

The first complementary signal input stage 100,110 receives a first pair of complementary data input signals (i1_p, i1_n) and the second complementary signal input stage 120,130 receives a second pair of complementary data input signals (i0_p, i0_n). The i1_p and i1_n signals carry complementary input data, and use RZ (return to zero) signaling. With complementary input data, (i1_p,i1_n)=(1,0) for a one, and (i1_p,i1_n)=(0,1) for a zero. Data is valid for half the clock cycle, and then returns to zero for the other half-clock cycle. Similarly the i0_p and i0_n signals carry a pair of complementary input data signals, and use RZ (return to zero) signaling.

The circuit outputs a pair of complementary RZ data output signals at nodes op and on. In this example, the (op,on)=(1,0) for a one, and (op,on)=(0,1) for a zero. Every half-cycle of the clock, the outputs on and op both return to power in this example.

The circuit receives mux select signals mux_sel0 and mux_sel1. The mux select signals in combination form a pair of complementary NRZ (non-return-to-zero) signals, and are valid for the whole clock cycle. The values of the mux select signals determine which input is selected, with (mux_sel0, mux_sel1)=(1,0) to select the input from the second complementary signal input stage, and (mux_sel0, mux_sel1)=(0,1) to select the input from the first complementary signal input stage.

Also shown is a storage circuit 150 composed of cross-coupled inverters 162,170 and a clocked storage circuit enable transistor 180. Inverter 162 is composed of PMOS transistor 164 and NMOS transistor 166, and has an input connected to node op and an output connected to node on. Inverter 170 is composed of PMOS transistor 172 and NMOS transistor 174, and has an input connected to node on and an output connected to node op. In addition, PMOS transistors 164,172 are connected to power, whereas NMOS transistors 166,174 are connected to the clocked storage circuit enable transistor 180.

Finally, also shown are two PMOS transistors 190,192, referred to herein as preset transistors. Preset transistor 190 is connected between node on and power and receives the clock as input. Similarly, preset transistor 192 is connected between nod op and power and also receives the clock, ck, as input.

The description above refers to ground and power. More generally, the circuit has two supply voltages; the supplies can be Vdd/Vss, power/ground or positive supply/negative supplies, high voltage rail/low voltage rail.

In operation, as described in further detail below with reference to the timing diagram of FIG. 3, when ck=0, the circuit is in a preset mode, with nodes op,on charging to high. When ck=1, the circuit is in a latch mode, sampling the new data and latching it to the storage circuit 150 based on edge triggering.

The purpose of transistor 180 is:
  to allow the storage circuit 150 to be enabled while ck is high, during which period the storage circuit 150 helps to switch on low or op low, depending on the input data; and
  to disable the storage circuit 150 while ck is low, such that nodes on,op can be charged to preset state.

Figure 3:
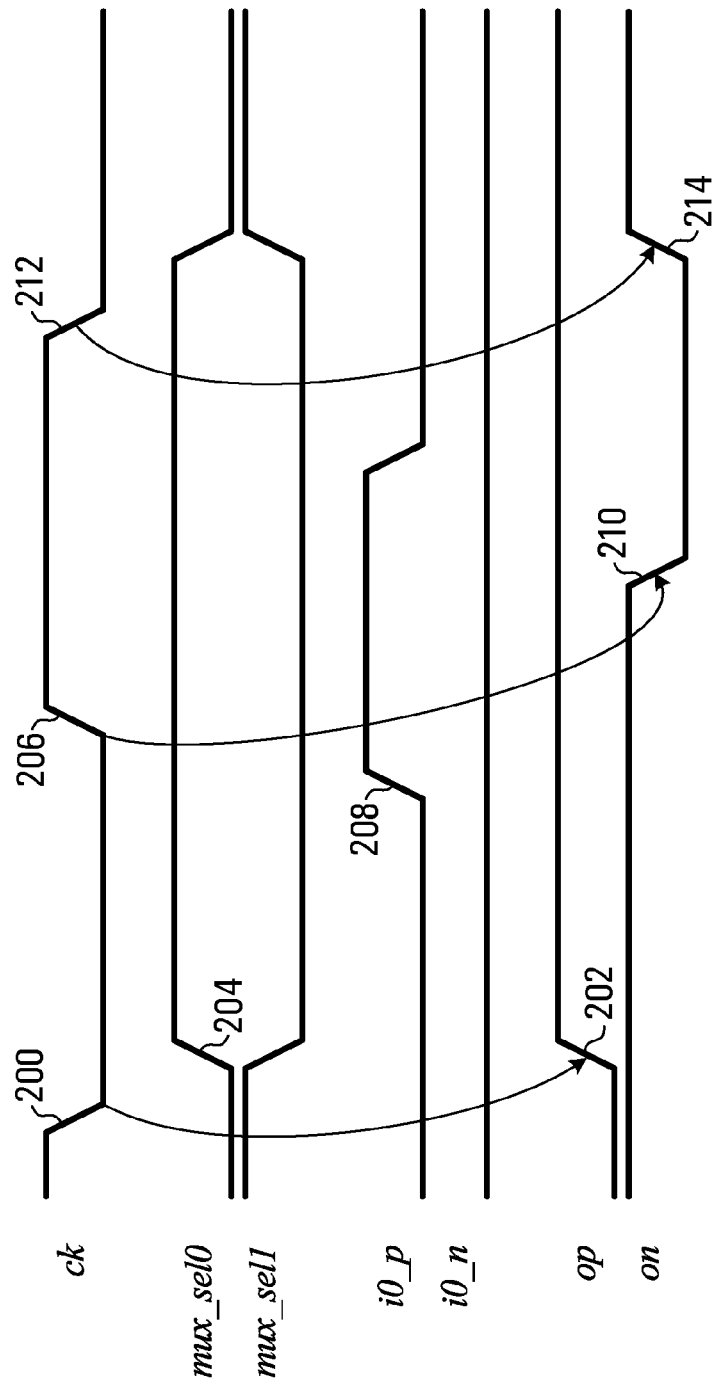
FIG. 3 is a timing diagram associated with the circuit diagram of FIG. 2.

Referring now to FIG. 3, shown is a timing diagram for the example case where a 1 is being sampled from nodes i0_p, i0_n which will be described to enable a further understanding of the functionality of the circuit of FIG. 2. Recall, a "1" input is represented by (1,0) at input nodes i0_p, i0_n. The timing diagram shows plots for ck, mux_sel0, mux_sel1, i0_p, i0_n, op and on. The starting state is:
  ck high,
  (mux_sel0, mux_sel1)=(0,1) meaning input 1 is selected
  i0_p,i0_n=(0,0) (return-to-zero state)
  op,on=0,1 (a 0 output from reading input 1 during previous cycle)

Preset: When ck is low, the circuit is in a preset mode. More specifically, when ck falls at 200, both preset transistors 190, 192 turn on, and the outputs op and on are pulled high. Note that the PMOS preset transistors 190,192 are configured to be able to over-power the NMOS input stages 100,110,120,130 for ck=0, as otherwise, the output could change before it is supposed to. As a result, the latch outputs op,on are preset high at 202. In addition, while ck is low, storage circuit enable transistor 180 is off, so as to allow the preset transistors to pull both outputs high.

Mux selection: At 204, mux_sel0 rises, and mux_sel1 falls meaning that the next data to be sampled will come from i0_p, i0_n. The timing of this relative to the clock is controlled by previous circuitry; in general, this transition happens while the circuit is in its preset phase (ck=0), such that the mux selection will be complete by the time ck rises.

New data arrival: New data arrives at i0_p,i0_n at 208. The timing of this relative to the clock is controlled by the previous circuitry; in general, nodes i0_p,i0_n should become valid while the circuit is still in its preset phase, so as to be ready for sampling when ck rises. It is noted that it does not matter whether the mux sel arrives before or after the data. However, it is preferred that they both arrive before the clock (or at least not after the clock). The danger of not operating the circuit in this manner is that if there was a large offset in the latch (one side stronger than the other), then the circuit could begin to switch in the wrong direction before data was available.

Data sampling: When ck rises at 206, the signals at nodes i0_p, i0_n are sensed. Recall, for this example, the signals are (1,0). This begins to pull down node on at 210. At the same time, ck rising also turns on storage circuit enable transistor 180 thereby enabling the storage circuit 150 and causing the cross-coupled inverters 162,170 to further pull on low while keeping op high, for an output of (op,on)=(1,0)

When ck falls at 212, the latch outputs op,on are preset to high again at 214, and the circuit returns to the preset mode. Thus, the output data is valid for half a clock period.

It can be seen that while the latch is still in its preset mode (ck=0), the input data becomes valid, and mux-select control signals choose the input data, this being the mux function. When the storage circuit switches to its latching mode (ck=1), the muxed data is passed to the output while simultaneously being latched, this being the latch function. That is to say, the data appears at the output following ck going high without having to pass through another circuit. The architecture may allow for both the input data and the mux select signals to be high speed, as in a high speed feedback path used in a DFE (decision feedback equalizer). Compared to alternative solutions, latency and power may be reduced.

Example applications of the described combined multiplexer and latch circuits include data recovery circuits, equalizers such as decision feedback equalizers, circuits that include a feedback path and are therefore speed sensitive, multiplexer/demultiplexer circuits, digital PLLs (digital phase locked loops), and microprocessors.

As described above, the circuit of FIG. 2 is configured for return-to-zero signaling for the first and second input signals and the output of the combined multiplexer and latch circuit, and for non-return-to-zero signaling for the multiplexer select input signals.

In another embodiment, a similar combined multiplexer and latch circuit is provided that is configured for return-to-zero for the output of the combined multiplexer and latch circuit, return-to-zero signaling for the first and second input signals, and for return-to-zero signaling for the multiplexer select input signals.

In another embodiment, a similar combined multiplexer and latch circuit is provided that is configured for return-to-zero for the output of the combined multiplexer and latch circuit, non-return-to-zero signaling for the first and second input signals, and for return-to-zero signaling for the multiplexer select input signals.

Figure 4:
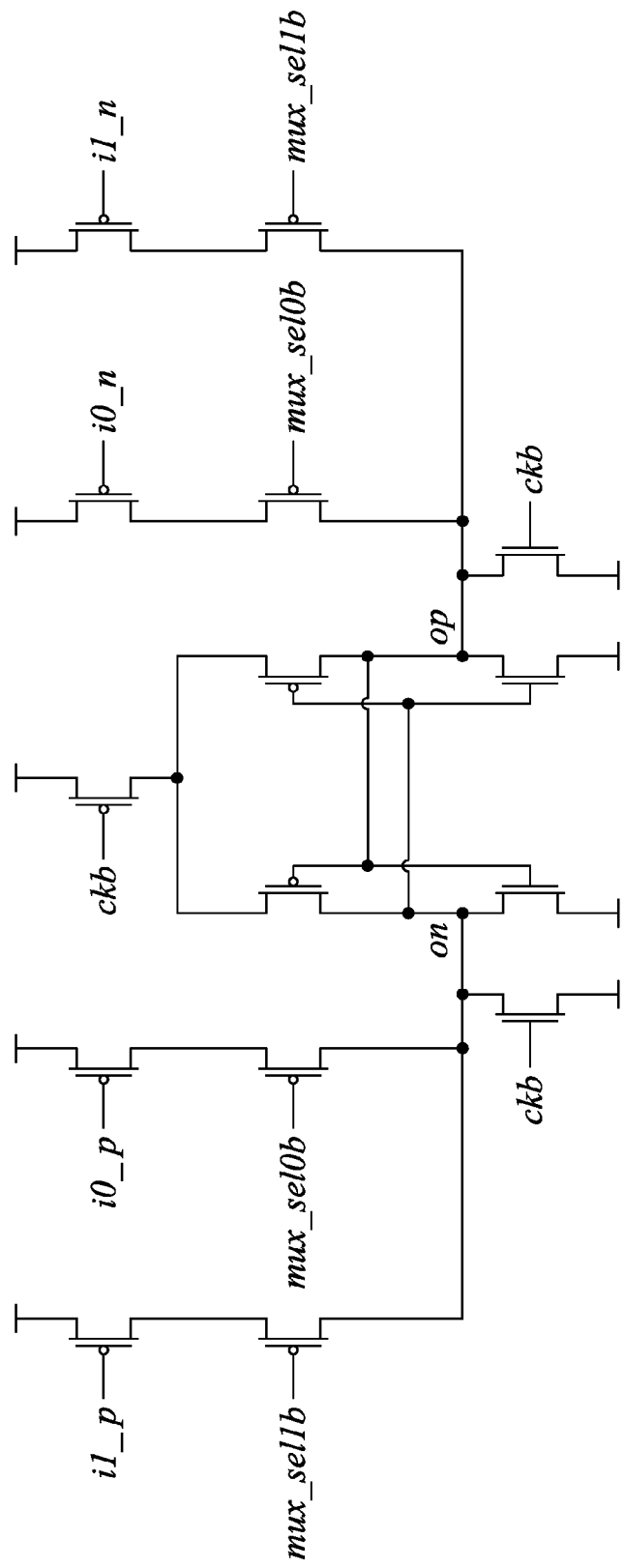
FIG. 4 is a simplified circuit diagrams of a combined multiplexer and latch circuit provided by an embodiment of the invention.

FIG. 4 is a circuit diagram of another combined multiplexer and latch circuit provided by an embodiment of the invention. This circuit is similar to that of FIG. 2, but whereas the circuit of FIG. 2 is based on a clock that is active high, and mux select active high, the circuit of FIG. 4 is based on a clock that is active low and mux select active low.

The embodiments described have assumed two complementary signal input stages, and the input is selected between using the multiplexer select signals. More generally, there may be two or more complementary signal input stages, one of which is selected using multiplexer select signals. For example, in one embodiment, there are 4 sets of inputs i0_p/n, i1_p/n, i2_p/n, i3_p/n, four multiplexer select signals mux_sel0, mux_sel1, mux_sel2, mux_sel3, and only one of the mux_sel signals goes high at a time.

Figure 5:
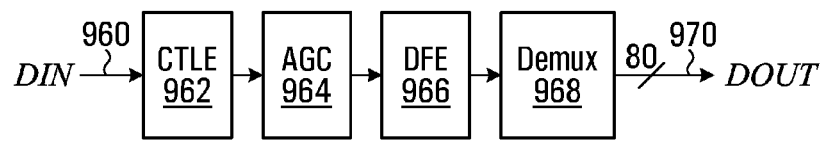
FIG. 5 is a simplified block diagram of a SerDes receiver

Referring now to FIG. 5, shown is a simplified block diagram of a SerDes (serializer/deserializer) receiver path provided by an embodiment of the invention. A SerDes is a pair of functional blocks (transmitter and receiver) commonly used in high speed communications to compensate for limited input/output, or to convert a high speed serial signal to a slower speed parallel circuit for digital processing. These blocks convert data between serial data and parallel interfaces in each direction. The term "SerDes" generically refers to interfaces used in various technologies and applications. The primary use of a SerDes is to provide data transmission over a single/differential line in order to reduce the number of I/O pins and interconnects compared to a parallel interconnection.

The receiver path depicted in FIG. 5 includes a DIN (data input) 960, CTLE (continuous time linear equalizer) 962, AGC: (automatic gain control) 964, DFE (decision feedback amplifier) 966, Demux (demultiplexer) 962, and DOUT (data output) 970. DOUT 970 may, for example have an 80 bit bus width, but other widths are possible. The receiver path takes a received serial input and converts it to a parallel output.

The DFE of FIG. 5 is implemented using, in part, a combined multiplexer and latch according to one of the embodiments described above.

Figure 6:
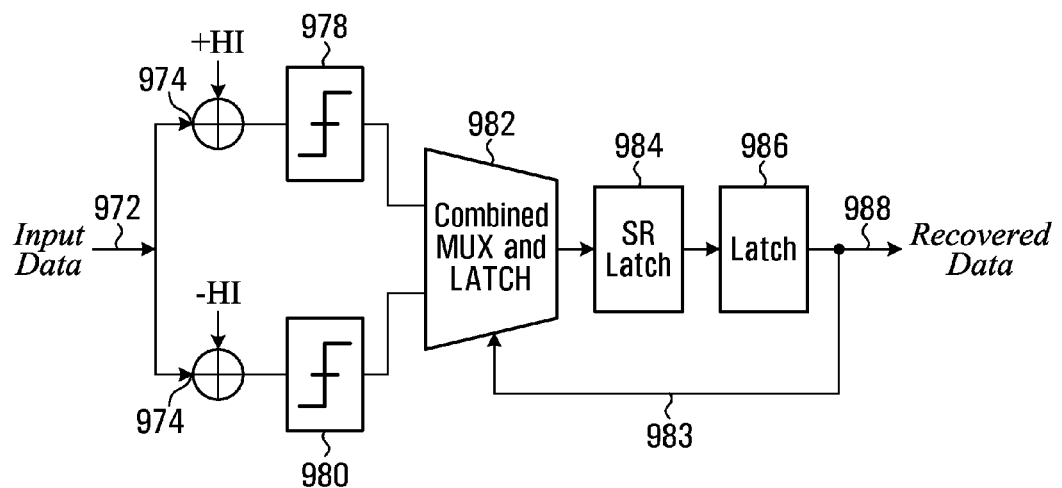
FIG. 6 is a simplified block diagram of a single tap unrolled DFE (decision feedback equalizer.

FIG. 6 is a simplified block diagram of a DFE that is used in a receiver block of a SerDes in some embodiments, and, for example, can be used as DFE 966 in the SerDes receiver of FIG. 5. This particular example is a single tap unrolled DFE.

The DFE has an input 972 connected to tap 974. The outputs of tap 974 are input to a respective slicer 978,980. The output of the two slicers 978,980 is input to a combined multiplexer and latch 982 having a select input 983. The output of the combined multiplexer and latch 982 is connected to an SR latch 984 which in turn is connected to a latch 986. The output of the latch is the recovered data output 988, and this is also fed back as select input 983 to the combined multiplexer and latch 982.

In operation, weights of +H1 and −H1 are added to the input using tap 974 and both potential solutions are sliced/latched with slicers 978,980. The combined multiplexer and latch 982 that follows chooses either the +H1 or −H1 solution based on the previous solution (it decides the current bit's solution based on whether the previous bit was a 1 or 0).

The combined multiplexer and latch 982 of the DFE of FIG. 6 is implemented using the combined multiplexer and latch according to one of the embodiments described above. It should be understood that there are a wide range of implementation options for a DFE making use of the combined multiplexer and latch according to one of the embodiments described above, and FIG. 6 is a very specific example.

Figure 7:
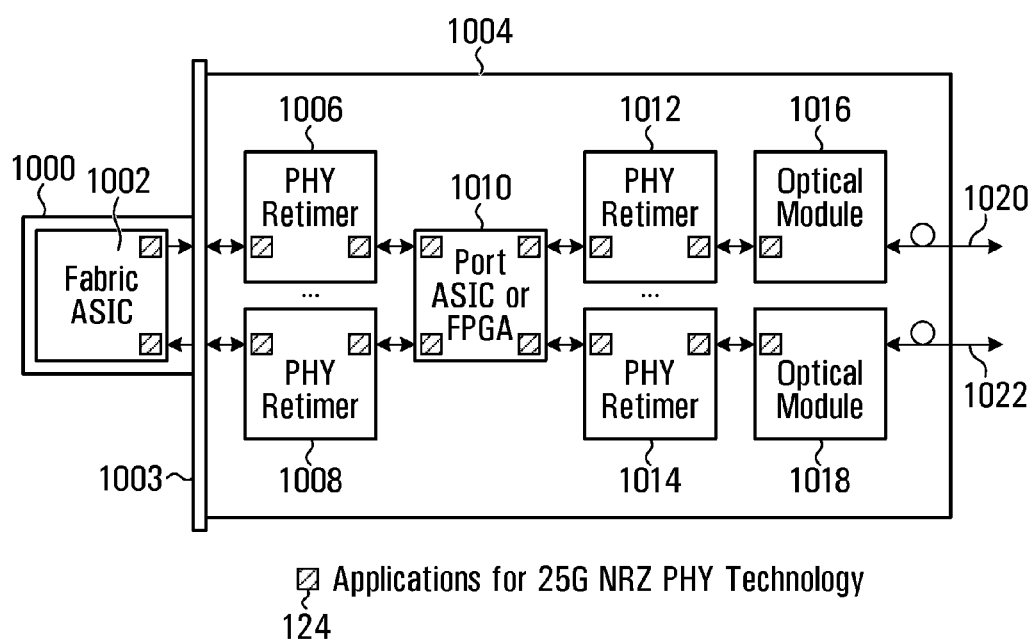
FIG. 7 is a simplified block diagram of a system employing 25 G NRZ technology.

Referring now to FIG. 7 shown is a simplified block diagram of an example system using 25 G NRZ technology, that employs SerDes functionality, such as described with reference to FIG. 5, and including the use of the DFE of FIG. 6.

Shown is a first circuit board 1000 connected to a second circuit board 1004, for example through a backplane or long board trace. The first circuit board 1002 includes fabric ASIC 1000. The second circuit board 1004 includes a first PHY retimer 1006 connected to the fabric ASIC 1002, and also to port ASIC or FPGA 1010 which is then connected in sequence to PHY retimer 1012 and optical module 1016 which has an optical output 1020. Interconnections between components 1002,1006,1010,1012,1016 are all serial interconnections. PHY retimer 1008, port ASIC or FPGA, PHY retimer 1014 and optical module 1018 having optical output 1022 are interconnected in a similar manner.

In operation, the fabric ASIC 1002 may for example, receive data from several different port devices. Using information in the data, the device will route data to the appropriate destination port. The PHY retimers 1006,1008,1012,1014 clean up data signals after transmission over the backplane or long board trace, or more generally any channel that introduces degradation. The port ASIC or FPGA reads data traversing through the device for the purpose of analyzing, capturing, or modifying the data before it is output. The optical module 1016 is an interface between optical signaling and electrical signaling. Typically, the fabric ASIC 1002, PHY retimers 1006,1008,1012,1014, port ASIC or FPGA 1010 are each a respective integrated circuit that is mounted to a circuit board. Each optical module 1016,1018 might include a number of integrated circuits, with each module as a whole plugged into circuit board 1004.

The system shows a number of blocks 124 which implement SerDes functionality, such as that of FIGS. 5 and 6, but more generally, which makes use of the combined multiplexer and latch functionality described previously. While the example shows such SerDes functionality being employed in numerous different locations, more generally in one embodiment, the SerDes functionality is used for at least one serial to parallel interface.

The SerDes blocks 124 convert the serial I/Os to/from parallel signals employed by digital circuitry within, for example, the PHY retimers, port ASIC or FPGA, Fabric ASIC or optical modules.

Another embodiment of the invention provides an integrated circuit with one or more SerDes blocks that convert serial I/Os to parallel signals; digital circuitry that operates on the parallel signals. A PHY retimer, port ASIC or FPGA or fabric ASIC are specific examples of such integrated circuits. It should be understood that the SerDes blocks might be implemented as in FIG. 5, but this is not necessarily the case. More generally, whatever the implementation is, the SerDes blocks make use of the combined multiplexer and latch functionality described above.

In an example, the present techniques can be used for regulating memory devices (e.g., DDR 4 SDRAM devices, DDR4 register devices, DDR4 controller devices), and other high speed data applications. Additionally, such techniques can be used for a variety of applications such as network and/or computer storage systems, computer servers, hand held computing devices, portable computing devices, computer systems, network appliances and/or switches, routers, and gateways, and the like.

Numerous modifications and variations of the present disclosure are possible in light of the above teachings. It is therefore to be understood that within the scope of the appended claims, the disclosure may be practiced otherwise than as specifically described herein.

We claim:

1. A combined multiplexer and latch circuit comprising:
   a first complementary signal input stage comprising a first input circuit and a second input circuit configured to receive respective components of a first complementary input signal, and to receive a first multiplexer select input signal that enables the first complementary signal input stage, the first complementary signal input stage having an output connected to an output of the combined multiplexer and latch circuit, the first complementary signal input stage having a single gate delay between an input of the first complementary signal input stage and the output of the combined multiplexer and latch circuit;
   a second complementary signal input stage comprising first and second input circuits configured to receive respective components of a second complementary input signal, and to receive a second multiplexer select input signal that enables the second complementary signal input stage, the second complementary signal input stage having an output connected to the output of the combined multiplexer and latch circuit, the second complementary input signal having a single gate delay between an input of the second complementary signal input stage and the output of the combined multiplexer and latch circuit;
   a clocked preset circuit that presets a signal at the output of the combined multiplexer and latch circuit with timing based on a first phase of an input clock;
   a storage circuit configured to store a value based on the output of the combined multiplexer and latch circuit with timing based on a second phase of the input clock;
   a preset mode during which the output of the combined multiplexer and latch circuit is preset by the clocked preset circuit, and having a latch mode during which a value output by the selected complementary signal input stage is output by the circuit and also stored in the storage circuit.

2. The combined multiplexer and latch circuit of claim 1 configured for return-to-zero signaling for the first and second input signals and the output of the combined multiplexer and latch circuit, and for non-return-to-zero signaling for the multiplexer select input signals.

3. The combined multiplexer and latch circuit of claim 1 configured for return-to-zero for the output of the combined multiplexer and latch circuit, return-to-zero signaling for the first and second input signals, and for return-to-zero signaling for the multiplexer select input signals.

4. The combined multiplexer and latch circuit of claim 1 configured for return-to-zero for the output of the combined multiplexer and latch circuit, non-return-to-zero signaling for the first and second input signals, and for return-to-zero signaling for the multiplexer select input signals.

5. The combined multiplexer and latch circuit of claim 1 wherein the storage circuit comprises cross-coupled inverters, the storage circuit having an enable input that causes the storage circuit to latch values on the output of the combined multiplexer and latch circuit when the circuit goes into its latch mode.

6. The combined multiplexer and latch circuit of claim 5 wherein the storage circuit comprises a transistor connecting the cross coupled inverters to a high voltage rail to preset high, or a low voltage rail to preset low, and connected to receive the clock as input.

7. The combined multiplexer and latch circuit of claim 1 wherein each input circuit comprises:
   a transistor for receiving a data input;
   a transistor for receiving a multiplexer select input signal.

8. The combined multiplexer and latch circuit of claim 1 wherein the clocked preset circuit comprises:
   a first transistor connected between a voltage rail and a first component of the output, and connected to receive the clock input;

a second transistor connected between a voltage rail and a second component of the output, and connected to receive the clock input;

such that the first transistor and the second transistor pull the first and second components of the output towards the voltage rail while the first and second transistors are enabled.

9. The combined multiplexer and latch circuit of claim 1 further comprising:

at least one additional complementary signal input stage, each additional complementary signal input stage comprising:

first and second input circuits for receiving components of a respective additional complementary input signal, and for receiving a respective further multiplexer select input signal that enables the additional complementary signal input stage, the additional complementary signal input stage having an output connected to the output of the combined multiplexer and latch circuit, the additional complementary signal input stage having a single gate delay between an input of the first complementary signal input stage and the output of the combined multiplexer and latch circuit.

10. An integrated circuit comprising the combined multiplexer and latch of claim 1.

11. A SerDes (serializer deserializer) comprising
a serializer;
a deserializer, the deserializer comprising a combined multiplexer and latch, the combined multiplexer and latch circuit comprising:

a first complementary signal input stage comprising a first input circuit and a second input circuit configured to receive respective components of a first complementary input signal, and to receive a first multiplexer select input signal that enables the first complementary signal input stage, the first complementary signal input stage having an output connected to an output of the combined multiplexer and latch circuit, the first complementary signal input stage having a single gate delay between an input of the first complementary signal input stage and the output of the combined multiplexer and latch circuit;

a second complementary signal input stage comprising first and second input circuits configured to receive respective components of a second complementary input signal, and to receive a second multiplexer select input signal that enables the second complementary signal input stage, the second complementary signal input stage having an output connected to the output of the combined multiplexer and latch circuit, the second complementary input signal having a single gate delay between an input of the second complementary signal input stage and the output of the combined multiplexer and latch circuit;

a clocked preset circuit that presets a signal at the output of the combined multiplexer and latch circuit with timing based on a first phase of an input clock;

a storage circuit configured to store a value based on the output of the combined multiplexer and latch circuit with timing based on a second phase of the input clock;

a preset mode during which the output of the combined multiplexer and latch circuit is preset by the clocked preset circuit, and having a latch mode during which a value output by the selected complementary signal input stage is output by the circuit and also stored in the storage circuit.

12. The SerDes of claim 11 comprising a DFE (decision feedback equalizer), the DFE comprising said combined multiplexer and latch.

13. An integrated circuit comprising the SerDes of claim 12.

14. A method comprising:

receiving a first complementary input signal and a first multiplexer select signal with a first complementary signal input stage comprising first and second input circuits for receiving respective components of the first complementary input signal;

while selected by the first multiplexer select signal, producing an overall output based on the first complementary input signal with a single gate delay between receipt of the first complementary input signal and the overall output;

receiving a second complementary input signal and a second multiplexer select signal with a second complementary signal input stage comprising first and second input circuits for receiving respective components of the second complementary input signal;

while selected by the second multiplexer select signal, producing the overall output based on the second complementary input signal with a single gate delay between receipt of second complementary signal input stage and the overall output;

in a preset mode, presetting a signal at the overall output with timing based on a first phase of an input clock;

in a latch mode, storing a value based on the overall output with timing based on a second phase of the input clock.

15. The method of claim 14 comprising using return-to-zero signaling for the first and second input signals and the overall output, and non-return-to-zero signaling for the multiplexer select input signals.

16. The method of claim 14 comprising using return-to-zero signalling for the overall output, return-to-zero signaling for the first and second input signals, and return-to-zero signaling for the multiplexer select input signals.

17. The method of claim 14 comprising using return-to-zero signalling for the overall output, non-return-to-zero signaling for the first and second input signals, and return-to-zero signaling for the multiplexer select input signals.

18. The method of claim 14 further comprising:

enabling the storage circuit with an enable input that causes the storage circuit to latch values on the overall output when in the latch mode.

19. The method of claim 14 wherein:

receiving a first complementary input signal comprises receiving a first component of the first complementary input signal with a first transistor, and receiving the first multiplexer select signal with a second transistor, and receiving a second component of the first complementary input signal with a third transistor, and receiving the first multiplexer select signal with a fourth transistor; and receiving a second complementary input signal comprises receiving a first component of the second complementary input signal with a fifth transistor, and receiving the second multiplexer select signal with a sixth transistor, and receiving a second component of the second complementary input signal with a seventh transistor, and receiving the second multiplexer select signal with an eighth transistor.

20. The method of claim 14 wherein presetting the signal at the overall output with timing based on a first phase of an input clock is performed with a preset circuit comprising:

a first transistor connected between a voltage rail and a first component of the overall output, and connected to receive the clock input;

a second transistor connected between a voltage rail and a second component of the overall output, and connected to receive the clock input;

such that the first transistor and the second transistor pull the first and second components of the output towards the voltage rail while the first and second transistors are enabled.

* * * * *